United States Patent
Koehler et al.

(10) Patent No.: US 9,064,891 B2
(45) Date of Patent: Jun. 23, 2015

(54) GATE ENCAPSULATION ACHIEVED BY SINGLE-STEP DEPOSITION

(71) Applicant: GLOBALFOUNDRIES Inc., Grand Cayman (KY)

(72) Inventors: Fabian Koehler, Dresden (DE); Itasham Hussain, Dresden (DE); Bianca Antonioli-Trepte, Stolpen (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 132 days.

(21) Appl. No.: 13/942,829

(22) Filed: Jul. 16, 2013

(65) Prior Publication Data
US 2015/0024560 A1    Jan. 22, 2015

(51) Int. Cl.
*H01L 29/66*   (2006.01)
*H01L 21/28*   (2006.01)
*H01L 29/78*   (2006.01)
*H01L 29/51*   (2006.01)

(52) U.S. Cl.
CPC ......... *H01L 29/6656* (2013.01); *H01L 29/6659* (2013.01); *H01L 29/7833* (2013.01); *H01L 21/28176* (2013.01); *H01L 21/28202* (2013.01); *H01L 29/518* (2013.01)

(58) Field of Classification Search
CPC ............... H01L 21/28176; H01L 21/28202; H01L 21/31604; H01L 29/518; H01L 29/6659; H01L 29/7833
USPC ......... 438/197, 216, 591, 791; 257/E21.626, 257/E21.19, E29.255
See application file for complete search history.

(56) References Cited

U.S. PATENT DOCUMENTS

| | | | |
|---|---|---|---|
| 6,461,979 B1 | 10/2002 | Lin et al. | |
| 6,537,677 B1 | 3/2003 | Mercaldi et al. | |
| 6,773,970 B2 * | 8/2004 | Komatsu | 438/149 |
| 2003/0181015 A1 * | 9/2003 | Komatsu | 438/303 |
| 2005/0048728 A1 * | 3/2005 | Kawahara | 438/287 |
| 2009/0242999 A1 * | 10/2009 | Koehler et al. | 257/410 |
| 2009/0246371 A1 | 10/2009 | Koehler et al. | |
| 2013/0309829 A1 * | 11/2013 | Fang et al. | 438/285 |

OTHER PUBLICATIONS

Koehler et al., U.S. Appl. No. 14/097,909, filed Dec. 5, 2013.

* cited by examiner

*Primary Examiner* — Thinh T Nguyen
(74) *Attorney, Agent, or Firm* — Amerson Law Firm, PLLC

(57) ABSTRACT

When forming spacer structures enclosing a gate electrode structure of a transistor, a common problem is given by the thickness variation of the spacer structure obtained as a result of a first deposition process performed in a first chamber and a second, subsequent process performed in a second chamber. The present disclosure provides a method for forming spacers of a well-defined thickness. The method relies on a single deposition step performed by means of an atomic layer deposition. The deposition is performed in two stages performed at different temperatures.

23 Claims, 16 Drawing Sheets

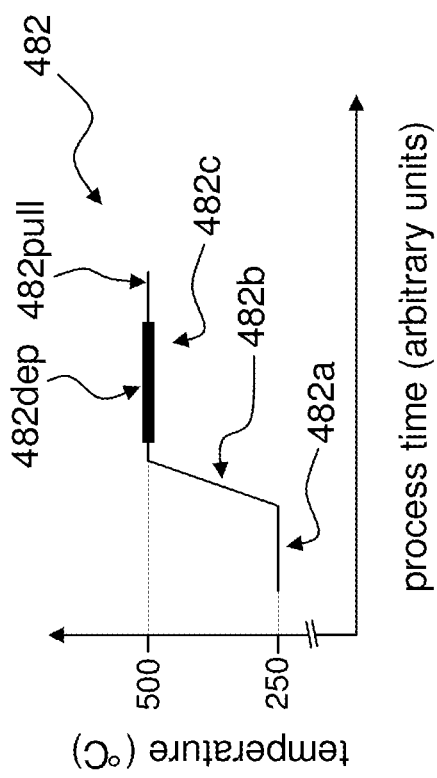
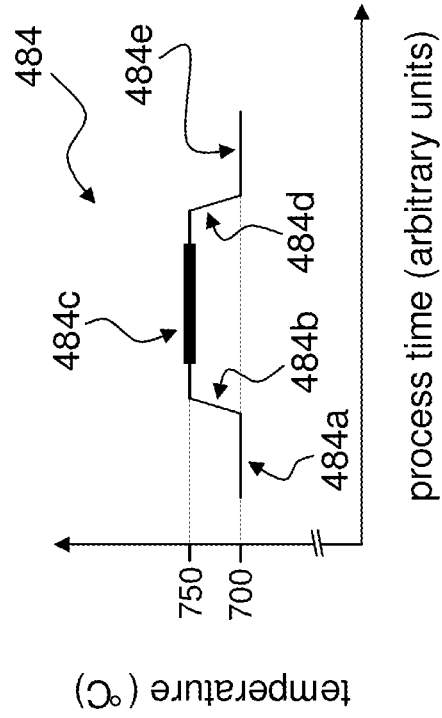
Fig. 4a (prior art)
Fig. 4b (prior art)

GATE ENCAPSULATION ACHIEVED BY SINGLE-STEP DEPOSITION

BACKGROUND OF THE INVENTION

1. Field of the Invention

The present disclosure generally relates to methods for fabricating integrated circuits, and, more particularly, to methods for fabricating integrated circuits with improved spacers.

2. Description of the Related Art

The ongoing trend in electronics towards more and more complex integrated circuits requires the dimensions of electronic devices to decrease in order to achieve a higher and higher integration density.

Transistors are the dominant circuit elements in current integrated circuits. Currently, several hundred millions of transistors may be provided in presently available complex integrated circuits, such as microprocessors, CPUs, storage chips and the like. It is then crucial that the typical dimensions of the transistors included in an integrated circuit are as small as possible, so as to enable a high integration density.

Among the various fabrication technologies of integrated circuits, the MOS (metal-oxide-semiconductor) technology is currently the most promising approach, since it enables producing devices with superior characteristics in terms of operating speed, power consumption and cost efficiency. The CMOS (complementary metal-oxide-semiconductor) technology is a particular implementation of the MOS technology wherein pairs of complementary transistors, i.e., P-channel transistors and N-channel transistors grouped in pairs, are used for forming circuit elements, such as inverters and other logic gates to design highly complex circuit assemblies. During the fabrication of complex integrated circuits using CMOS technology, millions of transistors, i.e., N-channel transistors and P-channel transistors, are formed in active regions defined within a semiconductor layer supported by a substrate.

Presently, the layer in which most integrated circuits are formed is made out of silicon, which may be provided in crystalline, polycrystalline or amorphous form. Other materials such as, for example, dopant atoms or ions may be introduced into the original semiconductor layer.

A MOS transistor or generally a field-effect transistor (FET), irrespective of whether an N-channel transistor or a P-channel transistor is considered, comprises a source and a drain region, highly doped with dopants of the same species. An inversely or weakly doped channel region is then arranged between the drain and the source regions. The conductivity of the channel region, i.e., the drive current capability of the conductive channel, may be controlled by a gate electrode formed in the vicinity of the channel region and separated therefrom by a thin insulating layer. The conductivity of the channel region depends on, among other things, the mobility of the charge carriers and on the distance along the transistor width direction between the source and drain regions, which is also referred to as channel length. For example, by reducing the channel length, the channel resistivity decreases. Thus, an increased switching speed and higher drive current capabilities of a transistor may be achieved by decreasing the transistor channel length.

However, reduction of transistor channel length may not be pushed to extreme limits without incurring other problems. For example, the capacitance between the gate electrode and the channel decreases with decreasing channel length. This effect must then be compensated for by reducing the thickness of the insulating layer between the gate and the channel. For example, for a gate length of approximately 80 nm, a gate dielectric material based on silicon dioxide with a thickness of less than 2 nm may be required in high speed transistor elements. Such small thicknesses of the insulating might, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in order to increase the charge carrier mobility in the channel region, thereby also enhancing overall performance of field effect transistors.

One of the solutions found to the problem of the increased capacitance with reduction of transistor channel length consists of choosing an appropriate material for the insulating layer in the gate electrode. When fabricating transistors with typical gate dimensions below 50 nm, the so-called "high-k/metal gate" (HKMG) technology has by now become the new manufacturing standard. According to the HKMG manufacturing process flow, the insulating layer included in the gate electrode is comprised of a high-k material. This is in contrast to the conventional oxide/polysilicon (poly/SiON) method, whereby the gate electrode insulating layer is typically comprised of an oxide, preferably silicon dioxide or silicon oxynitride in the case of silicon-based devices. By high-k material it is referred to a material with a dielectric constant "k" higher than 10. Examples of high-k materials used as insulating layers in gate electrodes are tantalum oxide ($Ta_2O_5$), strontium titanium oxide ($SrTiO_3$), hafnium oxide ($HfO_2$), hafnium silicon oxide (HfSiO), zirconium oxide ($ZrO_2$) and the like.

HKMG enables increasing the thickness of the insulation layer in the gate electrode, thereby significantly reducing leakage currents through the gate, even at transistor channel lengths as low as 30 nm or smaller. However, implementation of HKMG brings about new technological challenges and requires new integration schemes with respect to the conventional poly/SiON technology.

For example, it has been found that when using hafnium oxide ($HfO_2$) as the insulating layer material in a transistor gate, an interaction of the insulating layer material with polycrystalline silicon also present in the gate takes place, resulting in a variety of issues such as a high threshold voltage of the transistor. Thus, new materials have to be found in order to tune the work function of gate electrode species, so as to adjust the transistor threshold voltage to a desired level. A thin "work function metal" layer is inserted for this purpose between the high-k dielectric and the gate material, typically polycrystalline silicon, placed above the high-k dielectric. The threshold voltage may thus be adjusted by varying the thickness of the metal layer. This gate metal layer typically comprises a titanium nitride (TiN) film, possibly in conjunction with a work function metal, such as aluminum.

Currently, two different schemes exist for implementing HKMG in the semiconductor fabrication process flow. In the first approach, called gate-first, the fabrication process flow is similar to that followed during the traditional poly/SiON method. Formation of the gate electrode, including the high-k dielectric film and the work function metal film, is initially performed, followed by the subsequent stages of transistor fabrication, e.g., definition of source and drain regions, silicidation of portions of the substrate surface, metallization, etc. On the other hand, according to the second scheme, also known as gate-last or replacement gate, fabrication stages, such as dopant ion implantation, source and drain region formation and substrate silicidation, are performed in the presence of a sacrificial dummy gate. The dummy gate is replaced by the real gate after the high-temperature source/drain formation and all silicide annealing cycles have been carried out.

Thus, the gate-first HKMG approach requires the gate electrode stack to withstand the high temperatures reached during the annealing steps performed in order to, e.g., activate the dopant species implanted in the source and drain regions or induce the silicidation process.

Furthermore, oxygen or other gaseous contaminants might likely diffuse into the gate insulation layer or the gate metal layer during the thermal budget undergone by the device. Oxygen diffusion is particularly fast at the typically high temperatures reached during the thermal budget. Oxygen or contaminant incorporation into the gate stack during device fabrication should be prevented from occurring, since this has been observed to vary the chemical and physical characteristics of the materials included in the gate structure in an undesirable manner. Thus, crucial features of the transistor to be fabricated, such as the threshold voltage, might not be defined in advance.

One more factor which could jeopardize the integrity of the gate stack during the fabrication process is provided by the series of wet or dry etches performed after gate formation in order to pattern or clean the device surface. Ideally, the gate stack should be unaffected by all patterning or surface cleaning processes carried out after gate stack formation.

Thus, in order to protect the sensitive gate materials during the subsequent fabrication stages, the gate stack is encapsulated into a dielectric casing formed on its sidewall. This protective layer, also known as "spacer" or "spacer structure," besides protecting the sensitive gate materials, is advantageously used as a mask when implanting dopants of a desired type into the semiconductor layer in which the transistor is formed. In this respect, the spacer structure may be formed in subsequent stages so as to have the appropriate shape and thickness during each implantation step.

In particular, the spacer structure may be comprised of an encapsulating portion formed adjacent to the stack sidewalls. A first spacer portion having a first thickness is then formed onto the encapsulating portion. This first portion is usually called "spacer-0." A first series of implantations may be performed using the spacer-0 as a mask. This first series may include implantations carried out in order to define halo regions in the transistor channel region and extension regions in the source and drain regions. Subsequently, the spacer structure may be broadened by forming a second portion onto the spacer-0 previously formed. This second portion is usually referred to as "spacer-1." A second series of implantations may then be performed in the presence of both spacer-0 and spacer-1, for example in order to define the deep regions of the source and drain regions.

According to the state of the art, the gate-encapsulating portion and spacer-0 are formed by using a two-stage process. The gate-encapsulating portion is initially formed at a first temperature by performing a first deposition step. Deposition of the gate-encapsulating portion is then followed by the formation of spacer-0, which exposes a surface to the outside. Spacer-0 is formed by carrying out a second deposition at a second temperature, which is usually higher than the first temperature. The entire process will be discussed more extensively in the following.

FIGS. 1a-1g illustrate some aspects of a typical process flow during fabrication of a FET according to the prior art. FIG. 1a schematically illustrates a cross-sectional view of a semiconductor structure 100 in a relatively advanced manufacturing stage. As shown, the semiconductor structure 100 comprises a substrate 101, such as a semiconductor material and the like, above which a semiconductor layer 102 is formed.

The semiconductor layer 102 is typically made of a silicon single crystal. The semiconductor layer 102 is laterally divided into a plurality of active regions 102a, which are to be understood as semiconductor regions in and above which one or more transistors are to be formed. For convenience, a single active region 102a is illustrated, which is laterally delimited by an isolation region 102b, such as a shallow trench isolation. Depending on the overall device requirements, the substrate 101 and the semiconductor layer 102, for instance initially provided as a silicon material, may form an SOI (silicon-on-insulator) architecture when a buried insulating material (not shown) is formed directly below the semiconductor layer 102. In other cases, initially the semiconductor layer 102 represents a part of the crystalline material of the substrate 101 when a bulk configuration is to be used for the semiconductor structure 100.

The semiconductor structure 100 includes a transistor 150 formed in and above active region 102a. FIG. 1a shows transistor 150, which can be a FET, during a fabrication stage following the formation of a gate electrode structure 160.

The gate structure 160 comprises gate electrode material 162, which may be comprised of polycrystalline silicon. The gate structure 160 further comprises an insulation layer 161 physically and electrically separating gate electrode material 162 from the transistor channel region to be formed in active region 102a. The gate electrode structure 160 may have any appropriate geometric configuration, for instance in terms of length and width. For example, the gate length, i.e., in FIG. 1a, the horizontal extension of electrode material 162, may be 50 nm or less.

Depending on the configuration of the gate electrode structure 160, insulation layer 161 and gate electrode material 162 may be formed in different ways.

For example, if the gate electrode 160 is a conventional oxide/polysilicon gate electrode (e.g., poly/SiON), then the gate insulation layer 161 may be formed from a conventional gate dielectric material, such as, for example, silicon dioxide, silicon oxynitride, and the like, whereas the gate electrode material 162 may comprise polysilicon.

Alternatively, an HKMG configuration may be preferred for gate electrode structure 160. HKMG is usually preferred for gate lengths of about 50 nm or smaller. In this case, the insulation layer 161 may be one of the high-k gate dielectric materials well known in the art. For example, a non-exhaustive list of high-k materials which may be used in transistor gates has been given above.

If the gate electrode structure 160 has been formed according to the HKMG technology, it also comprises a gate metal layer 162a, for instance in the form of tantalum nitride and the like, possibly in combination with a work function metal species, such as aluminum and the like. The gate metal layer 162a is typically formed above the insulation layer 161, thereby adjusting an appropriate work function and thus threshold voltage of the transistor 150, as discussed above.

As said above, in order to protect the stack of which gate electrode structure 160 is comprised, a spacer structure is formed on the sidewalls of the gate stack. The spacer structure is initially formed with a smaller thickness and subsequently broadened to a larger thickness.

FIGS. 1b-1d show a sequence of manufacturing stages resulting in the formation of the portion of the spacer structure comprising the encapsulating portion adjacent to the gate stack and an outer layer having a predetermined thickness, commonly called spacer-0.

As shown in FIG. 1b, during the initial stage of spacer formation, a deposition process 182 is performed so as to form a first insulating layer 144 on the surface of the semiconductor structure 100. The first insulating layer 144 is typically comprised of an insulating material such as, for example, silicon nitride (SiN). The layer 144 typically has a thickness between 3-4 nm and, preferably, of about 3.5 nm. The layer 144, formed so as to be in contact with the gate structure 160, is adapted to be patterned in order to form the encapsulating portion of the spacer structure.

The deposition process 182 used for forming the first insulating layer 144 is typically performed by means of an atomic layer deposition (ALD) process. The sequence of operations making up deposition 182 is schematically illustrated by broken line 482 in the plot of temperature as a function of time shown in FIG. 4a. Segment 482a indicates a boat push at 250° C. into the ALD furnace. The temperature is then ramped up to 500° C. during segment 482b. ALD deposition is performed thereafter at 500° C. during segment 482c of line 482. ALD deposition is indicated as a full rectangle 482dep in FIG. 4a. After performing ALD deposition 482dep, boat pull 482pull is carried out at 500° C.

The relatively low temperatures of 250° C. for boat push and of 500° C. for ALD are chosen when performing deposition 182 since they effectively prevent residual oxygen in the deposition chamber from reaching the gate stack 160. Once the gate stack 160 has been encapsulated by layer 144, it may endure higher temperatures in subsequent steps.

We now refer to FIG. 1c, showing semiconductor structure 100 during a fabrication stage following that shown in FIG. 1b. After depositing the first insulating layer 144, a second insulating layer 146 may be deposited by using a second deposition process 184. The second insulating layer 146 is deposited onto the surface of the first insulating layer 144. Usually, the second insulating layer 146 comprises the same insulating material as the first insulating layer 144. Thus, the second insulating layer 146 is typically comprised of SiN. The layer 146 has a thickness in the range of 8-9 nm and, preferably, of about 8.5 nm. The second insulating layer 146, formed onto the first insulating layer 144, is adapted to be patterned in order to form the portion of the spacer structure called spacer-0.

The deposition process 184 used for forming the second insulating layer 146 is typically performed by a low pressure chemical vapor deposition (LPCVD) process. This deposition process is schematically illustrated as a broken line 484 in the temperature versus process time plot shown in FIG. 4b. Segment 484a indicates a boat push at 700° C. into the LPCVD furnace. As shown by segment 484b, the temperature is then ramped up to 750° C. The deposition of layer 146, indicated as a full rectangle, is achieved by an LPCVD process at 750° C. during segment 484c. As indicated by segment 484d, the temperature is then decreased down to 700° C. and, finally, boat pull is performed at 700° C. in segment 484e.

The temperature of 750° C. during LPCVD of the second insulating layer 146 allows for formation of a spacer-0 with improved toughness. In particular, a spacer-0 formed from an insulating layer 146 grown by means of an LPCVD performed at the selected temperature turns out to have an extremely low etch rate when exposed to typical wet etches applied to the wafer after spacer-0 has been formed.

We now refer to FIG. 1d, showing the semiconductor structure 100 during a fabrication stage following that shown in FIG. 1c. After forming the first insulating layer 144 and second insulating layer 146, layers 144 and 146 may be patterned in order to remove those portions not lying in the proximity of the gate structure 160. In particular, one or more dry or wet etches may be used in order to pattern layers 144 and 146. The patterning step results in the formation of a spacer structure 140 comprising an encapsulating portion 144enc formed adjacent to the sidewalls of the gate structure 160. The encapsulating portion 144enc of spacer structure 140 has been obtained as a portion of the patterned first insulating layer 144. In the stage of the manufacturing process flow shown in FIG. 1d, the spacer structure 140 further comprises an outer portion 146sp0 exposed to the outside and obtained as a portion of the patterned second insulating layer 146. The outer portion 146sp0 forms the portion of the spacer structure 140 called spacer-0.

After forming the spacer structure 140 as shown in FIG. 1d, a series of doping implantations 188 may be performed in order to define extension regions and/or halo regions. The implantations 188 may comprise halo implantations and/or implantations performed in order to define extension regions 151e of source and drain regions 151. FIG. 1e shows the transistor 150 after performing the implantations 188 resulting in the formation of extension regions 151e of the source and drain regions. The extension regions 151e determine the length of the channel region of the transistor 150.

FIG. 1f shows the semiconductor structure 100 during a fabrication stage following that shown in FIG. 1e. After performing halo and/or extension region implantations, a third insulating layer, not shown in the figures, may be deposited by using a highly conformal deposition technique. This third insulating layer may be patterned so as to form the portion 148 of spacer structure 140 called spacer-1.

After broadening the spacer structure 140 by forming spacer-1 148, further implantation steps (not shown) may be performed in order to define deep regions 151d of source and drain regions 151. The semiconductor structure 100 may subsequently be annealed in order to activate the implanted dopants and cause the crystal lattice of semiconductor layer to re-crystallize after implantation damage. A certain amount of diffusion of the doping species may likely result from application of the annealing process. The channel region 155 of transistor 150 is defined as being delimited by extension regions 151e. Figure if schematically shows the semiconductor structure 100 after the activating annealing has been performed.

FIG. 1g shows the semiconductor structure 100 during an advanced stage of the manufacturing process flow following that shown in FIG. 1f. After performing the activating annealing, a refractory metal layer (not shown) is deposited onto the surface of device 100 shown in FIG. 1f, after the gate electrode structure 160 has been formed and source and drain regions 151 have been created. A heat treatment is then applied to the refractory metal layer at temperatures ranging from 300-500° C. As a result of the heat treatment, metal silicide layer 162b shown in FIG. 1g is formed partly in and partly on top of the upper surface of the gate electrode material 162, which was exposed before depositing the refractory metal layer. Analogously, a metal silicide layer 153 is formed partly in and partly on top of the upper surface of the semiconductor layer 102, which was exposed before depositing the refractory metal layer.

After forming metal silicide layers 153 and 162b, a stressed material layer 120 is deposited onto the exposed face of the semiconductor structure 100 by using a well-known deposition technique such as, for example, plasma-enhanced chemical vapor deposition (PECVD). Deposition of the stressed material layer 120 may be followed by a UV curing process.

The UV curing process, performed at a temperature in the range of 400-500° C., results in an increase of the tensile stress of the stressed material layer 120. The stressed material layer 120 comprises a dielectric material, typically silicon nitride (SiN), having an etch selectivity to a dielectric material layer 130 formed above the semiconductor structure 100 during a later manufacturing stage. Thus, the stressed material layer 120 acts also as an etch stop layer.

An interlayer dielectric material layer 130 is deposited onto the stressed material layer 120. The dielectric layer 130 may comprise any suitable dielectric material, such as, for example, silicon dioxide ($SiO_2$).

The dielectric material layer 130 and the stressed material layer 120 are generally deposited as continuous layers. Thereafter, an etching process, such as reactive ion etching (RIE), is performed on the semiconductor structure 100. Etching may be performed after placing an appropriately patterned etching mask 134 on the surface of the structure 100. Etching is performed in order to form via openings 172 and 174 exposing portions of metal silicide layer 153 contacting the source and drain regions 151 and portions of metal silicide layer 162b contacting gate electrode material 162, respectively.

In a subsequent fabrication step (not shown), via openings 172 and 174 are filled with a high electrical conductivity metal such as tungsten. This allows source and drain regions 151 and gate electrode 160 to be electrically contacted from the outside.

As discussed with reference to FIGS. 1b-1d, the encapsulating portion 144enc and the spacer-0 portion 146sp0 of the spacer structure 140 are formed by performing two consecutive thin-film depositions. More specifically, a first deposition stage 182 including an ALD is performed resulting in formation of the first insulating layer 144, followed by a second deposition stage 184 including an LPCVD and resulting in formation of the second insulating layer 146.

Typically, after performing the first deposition 182, the wafer in which the semiconductor structure 100 is formed is extracted from the first deposition chamber and stored in a carrier, e.g., a front opening universal pod (FOUP). After a variable amount of time, the carriers with the wafer are then transported to the chamber in which the second deposition 184 is to be performed and loaded therein.

This method is unsatisfactory since LPCVD 184 is separated in time from ALD 182 by a variable time interval called "q-time." The wait time between ALD 182 and LPCVD 184 may have an order of magnitude in the range of approximately 1 hour to 100 hours. In general, the wait time between the two deposition steps may vary depending on tool availability both at the metrology step and at the second LPCVD deposition step.

It has been observed that the thickness of the spacer structure 140 prior to halo and extension implantations critically depends on the q-time elapsing between ALD 182 and LPCVD 184. FIG. 3 shows a graph in which the thicknesses of spacer structures obtained in a series of experiments are plotted as a function of the q-time. The thickness has been obtained as the sum of the thicknesses of the first insulating layer 144 and the second insulating layer 146 shown in FIG. 1c. Circles, triangles and asterisks represent data points obtained with q-times smaller than 6 hours, in the range of 6-48 hours, and greater than 48 hours, respectively.

FIG. 3 clearly shows that the spacer thickness tends to decrease with increasing q-time. The decrease is more pronounced the shorter the q-time is.

One more drawback with the two-stage deposition process described above lies in the fact that carriers or enclosures such as FOUPs, wherein wafers are stored between the first deposition 182 and the second deposition 184 are typically not hermetically sealed. Thus, exposure of the wafers to air results in an oxidation of the surface of the first insulating layer 144 formed by ALD. Surface oxidation of the first insulating layer 144 causes a delay of the subsequent LPCVD growth on the oxidized surface. This results in a further decrease of the overall thickness of the two deposited layers and of the spacer structure.

It is observed that forming spacer structures 140 with a well-defined, repeatable thickness is crucial in order to enable precise halo and/or extension implantations in predetermined regions of the semiconductor layer 102. However, a well-defined, constant q-time may not be achieved in current production lines. Therefore, the effect of thickness reduction with increasing q-time is extremely undesirable.

One solution may be envisaged consisting of increasing the number of cycles of the ALD included in the first deposition stage 182 so as to achieve in one single step the total spacer thickness corresponding to the sum of the thicknesses of layers 144 and 146 shown in FIG. 1c. In this manner, the LPCVD included in the second deposition stage 184 may be omitted altogether. However, this solution may not be pursued, since the resistance to wet etch of a spacer obtained by ALD is usually inferior to that of a spacer resulting from an LPCVD process. In particular, in the case of a spacer comprised of silicon nitride, a nitride grown by ALD turns out to have a higher wet etch rate than a nitride grown by LPCVD, especially when ALD is performed at relatively low temperatures.

In order to solve the problem of the thickness variation of the spacer structure depending on the q-time, a spacer formation process may also be suggested, wherein both growth stages including an ALD and an LPCVD process, respectively, may be performed within the same apparatus. For example, an apparatus with two reaction chambers may be proposed and with a combined loading area. The first of the two chambers could be used for the ALD stage and the second one for the LPCVD. Unfortunately, such an apparatus is not currently available.

One more option would be a combined process including an ALD followed by an LPCVD performed in one single process chamber. However, existing ALD apparatuses may not be used for performing LPCVD of a nitride, as well as existing LPCVD apparatuses may not be used for performing ALD of a nitride.

Thus, in view of the drawbacks and problems illustrated above, it is an object of the present invention to provide a method of forming a spacer structure having a constant, predictable and repeatable thickness.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present invention is based on the inventive idea that the traditional two-step deposition process used in order to form the encapsulating portion of the spacer structure and spacer-0 may be advantageously replaced by a single atomic layer deposition performed at two different temperatures.

Based on this idea, a method of forming a transistor structure is provided. The method includes forming a gate structure on an active region of a semiconductor layer and performing an atomic layer deposition process so as to deposit a layer adapted to be formed as a spacer structure on the sidewalls of the gate structure, wherein the step of performing the atomic layer deposition process includes performing a first deposition stage at a first temperature and performing a second deposition stage at a second temperature after the first deposition stage, the second temperature being higher than the first temperature, wherein the first and second deposition stages of the atomic layer deposition are performed within the same deposition chamber.

BRIEF DESCRIPTION OF THE DRAWINGS

The disclosure may be understood by reference to the following description taken in conjunction with the accompanying drawings, in which like reference numerals identify like elements, and in which:

FIG. 4a shows a graph of temperature as a function of time for a deposition process according to the prior art;

FIG. 4b shows a graph of temperature as a function of time for a further deposition process according to the prior art.

Figure 1A:
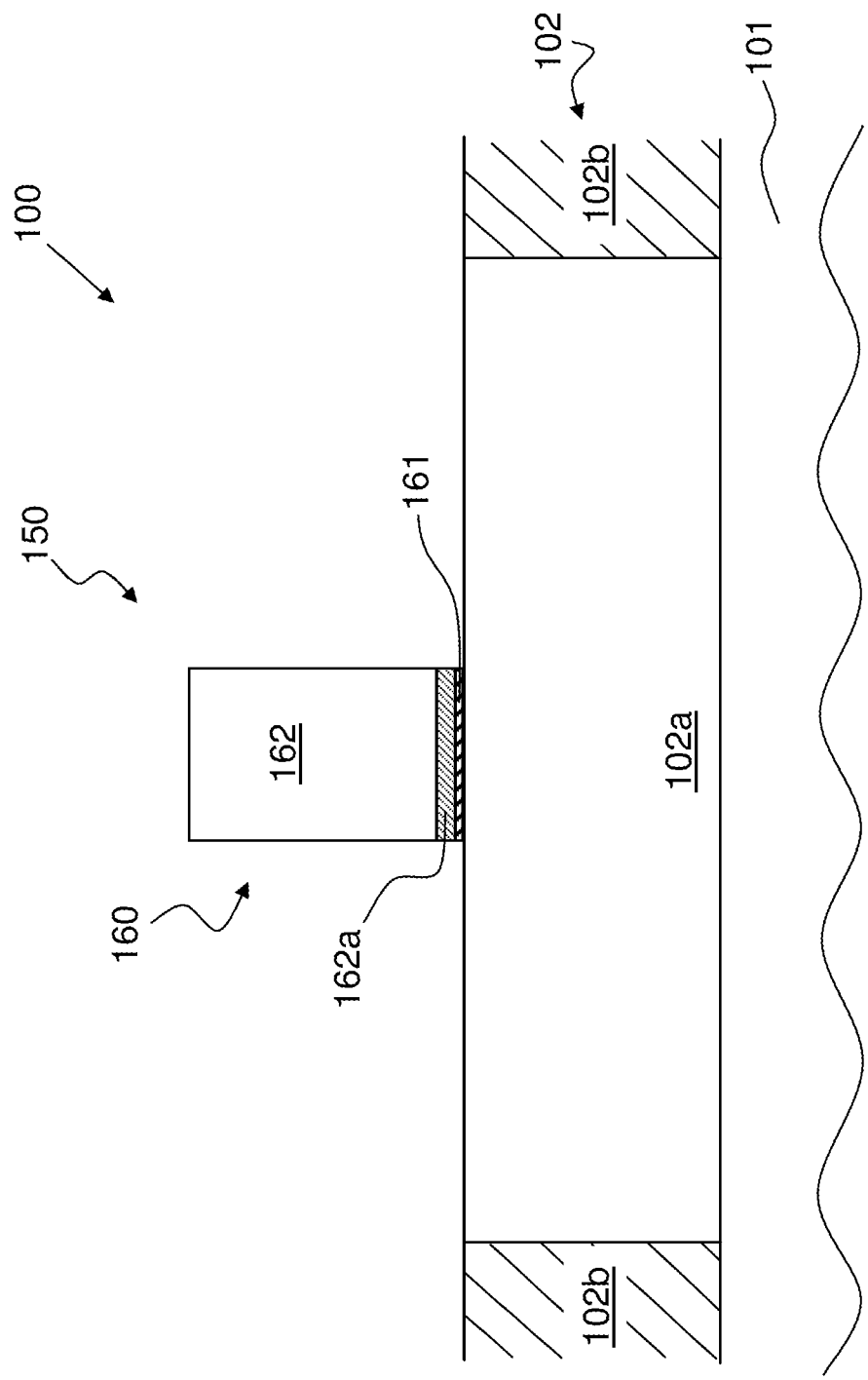
FIGS. 1a-1g schematically illustrate cross-sectional views of a semiconductor structure comprising a transistor during subsequent stages of a fabrication process flow according to the prior art.
Figure 1B:
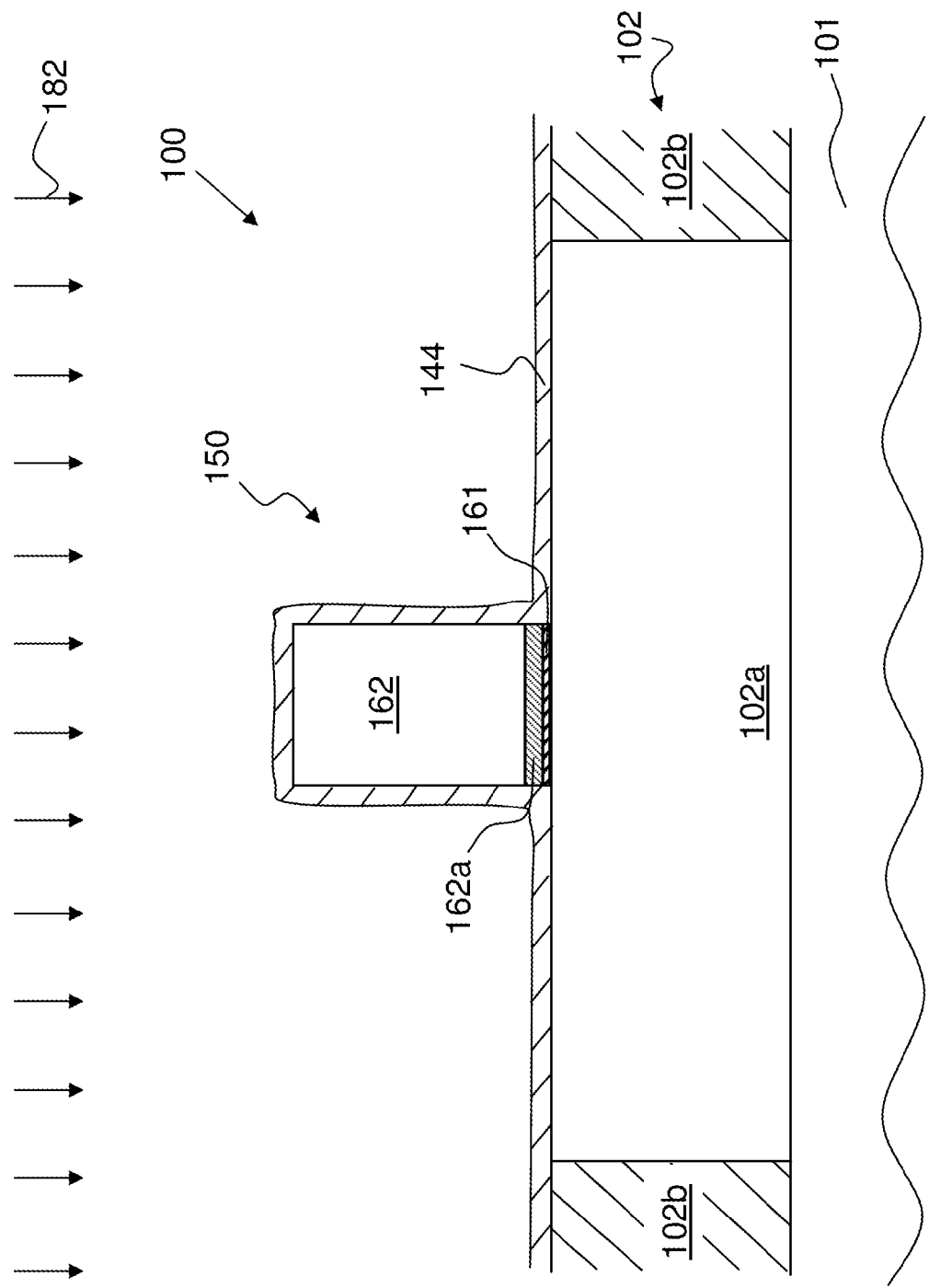
Figure 1C:
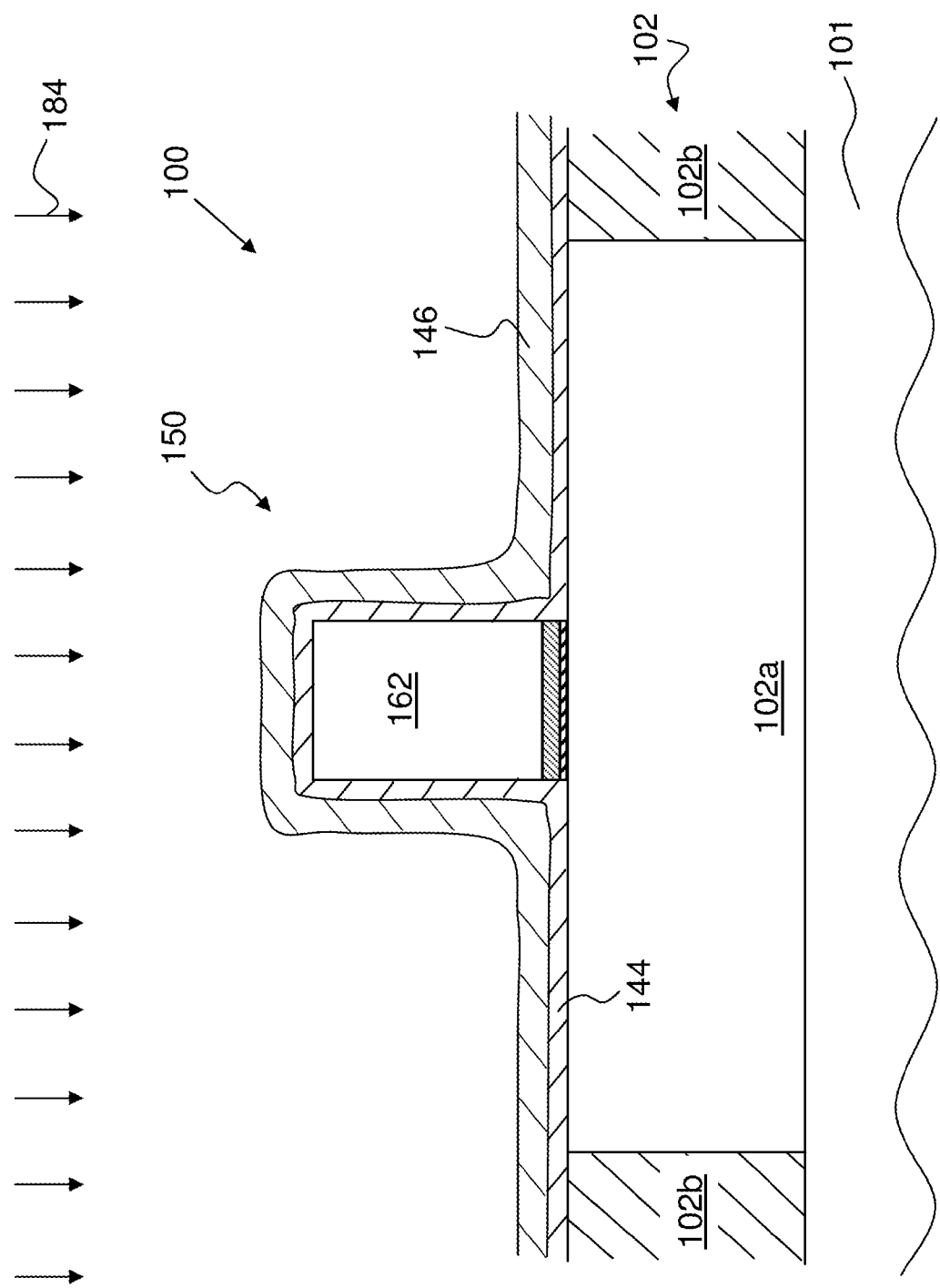

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Figure 1D:
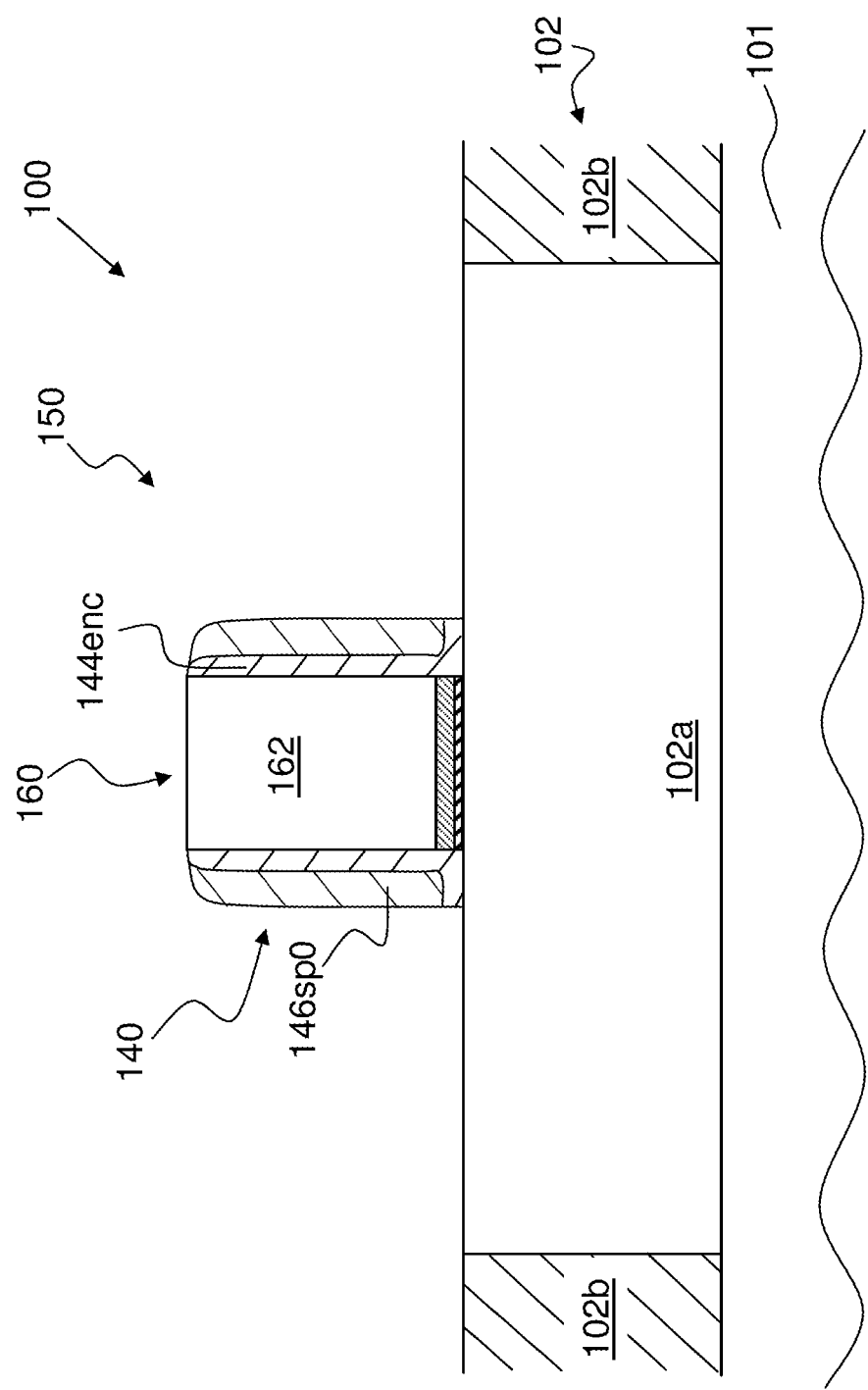
Figure 1E:
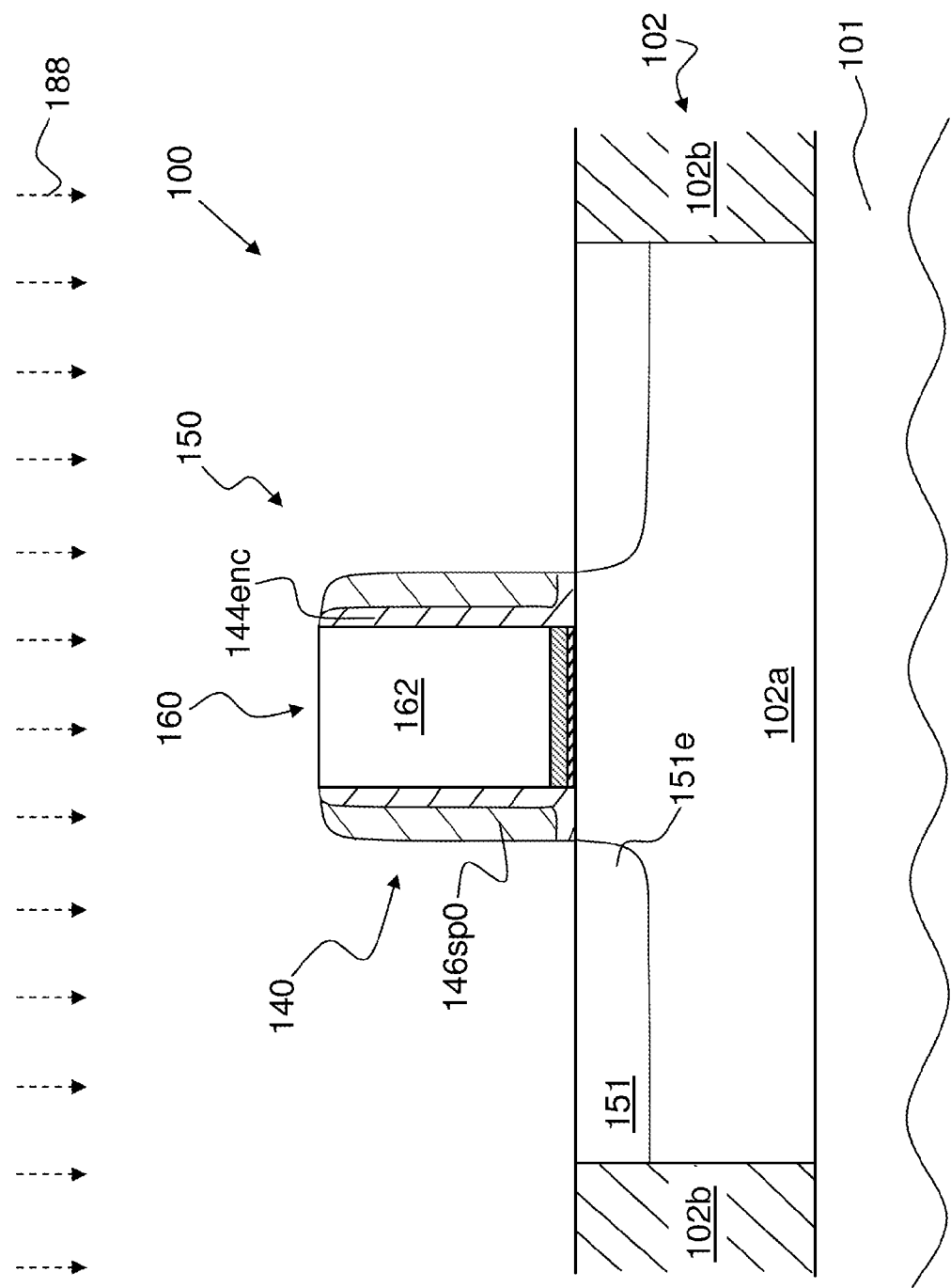
Figure 1F:
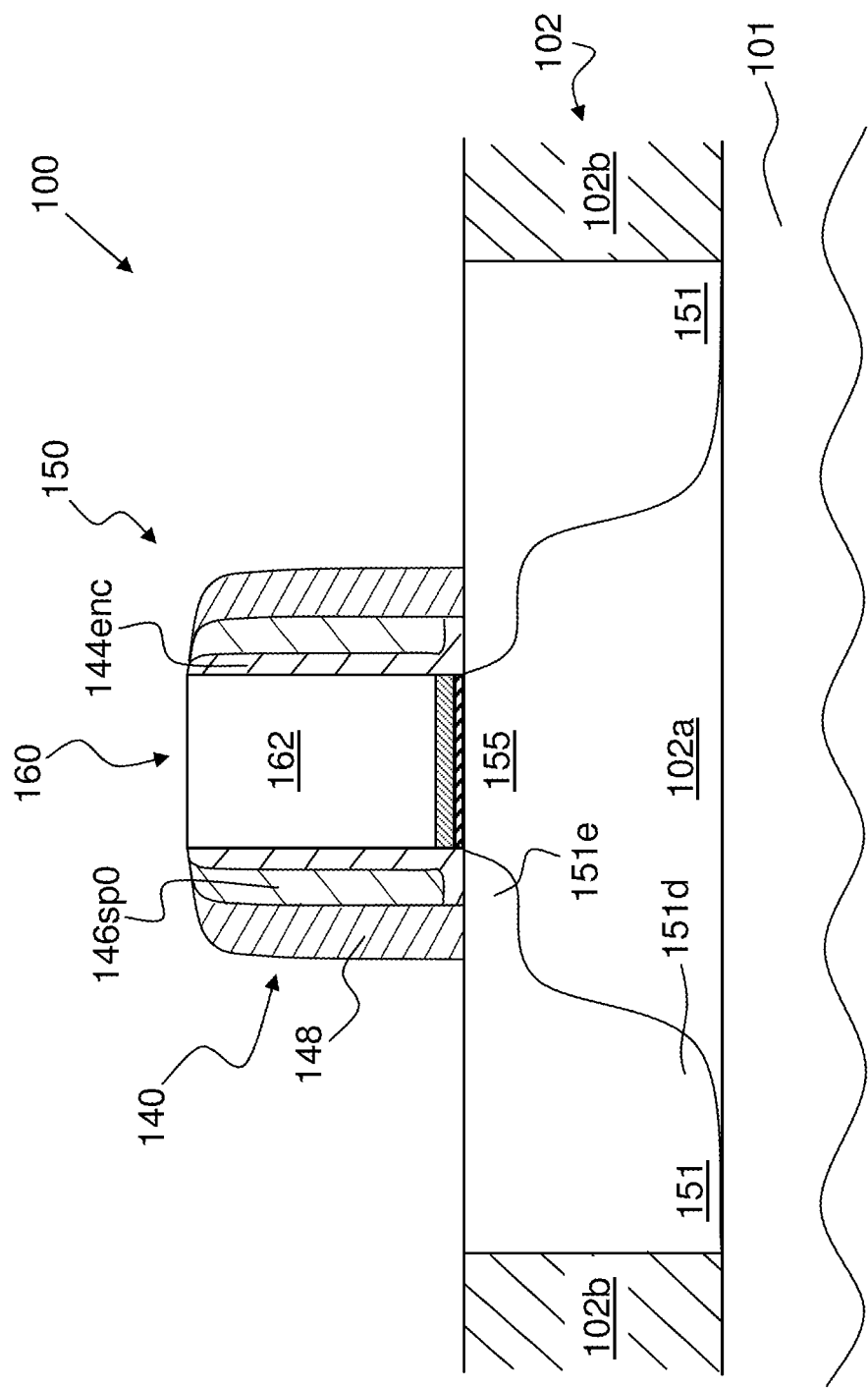
Figure 1G:
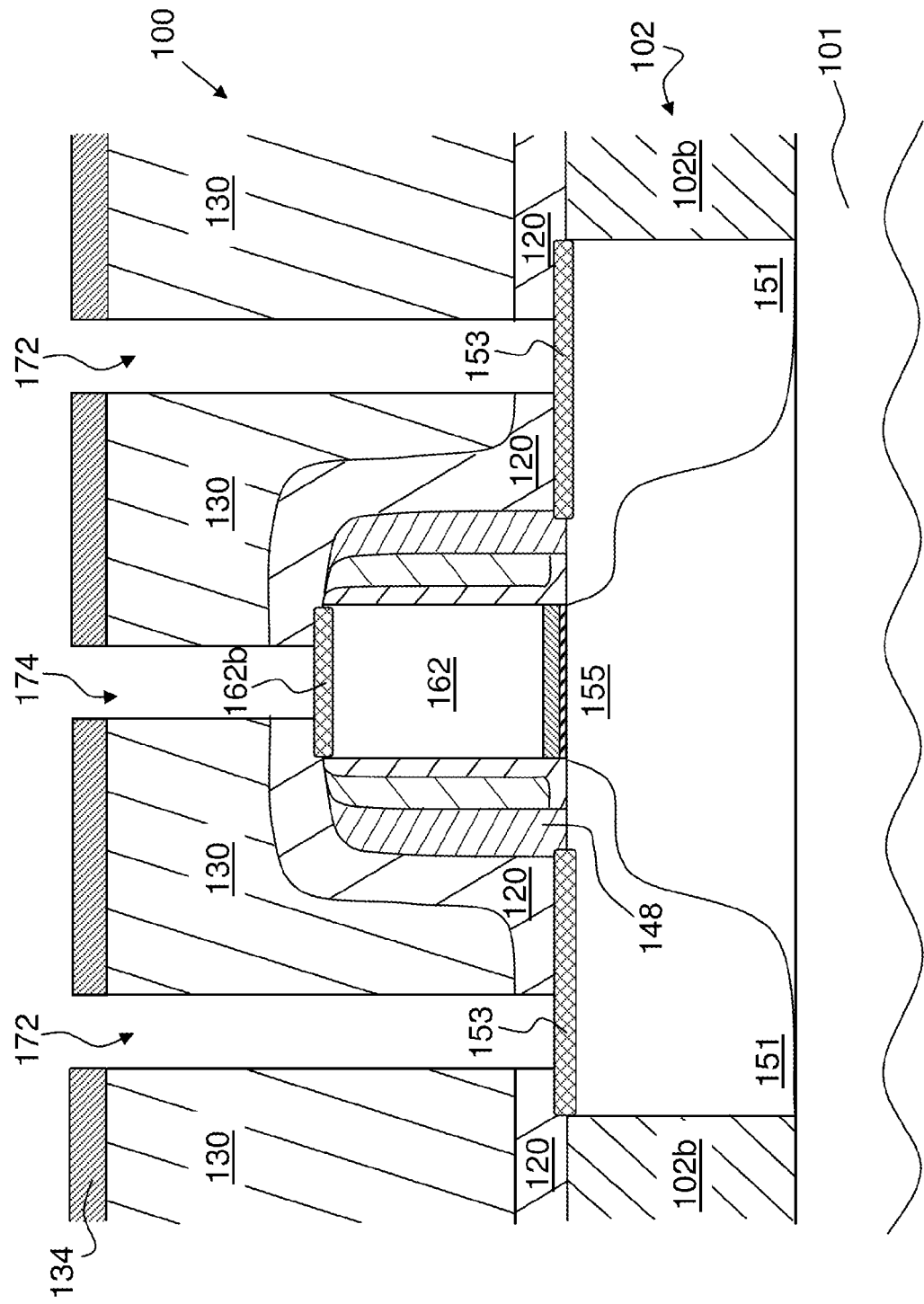
Figure 2A:
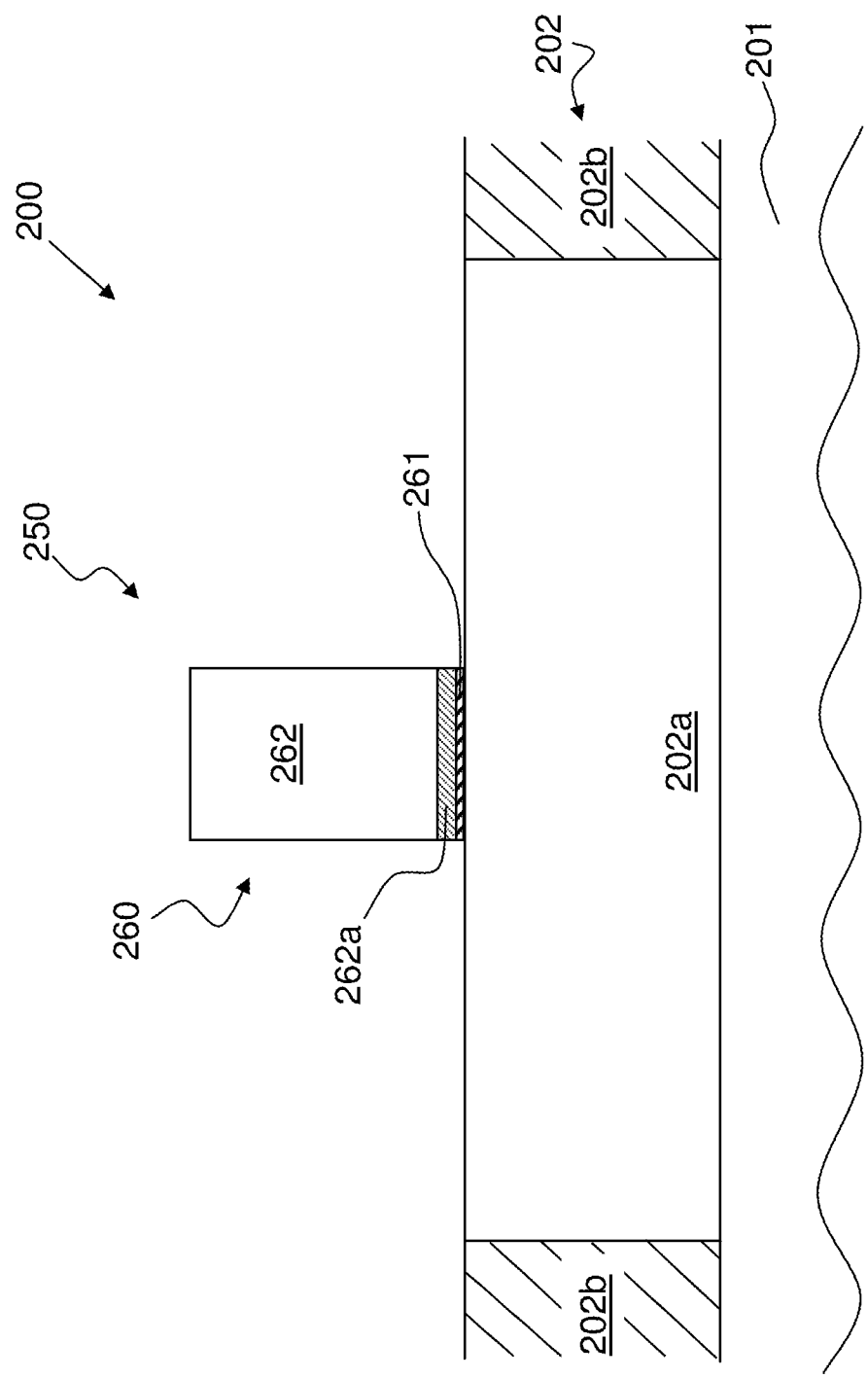
FIGS. 2a-2f schematically illustrate cross-sectional views of a semiconductor structure during subsequent manufacturing stages according to an embodiment of the method according to the present invention.
Figure 2B:
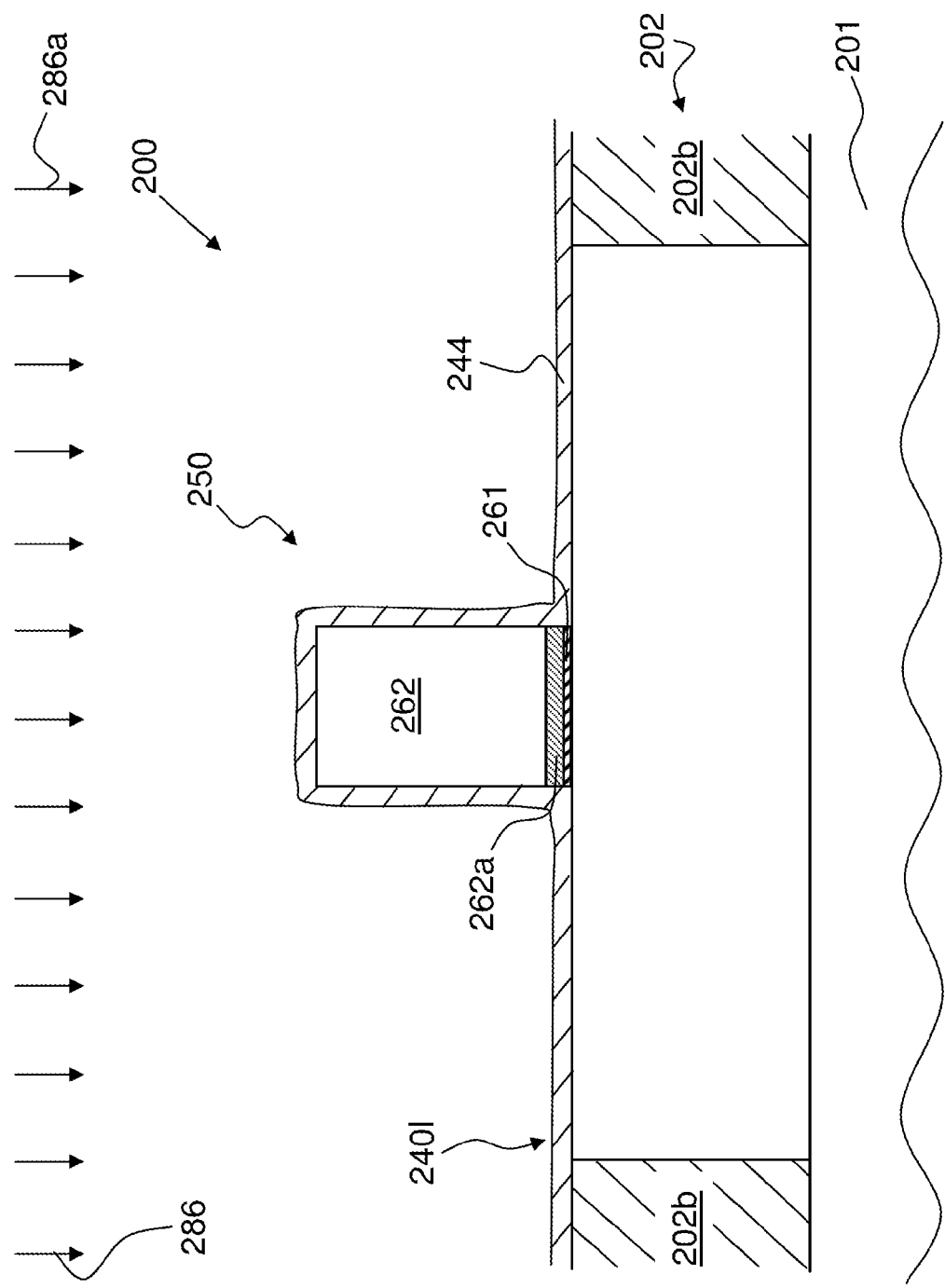
Figure 2C:
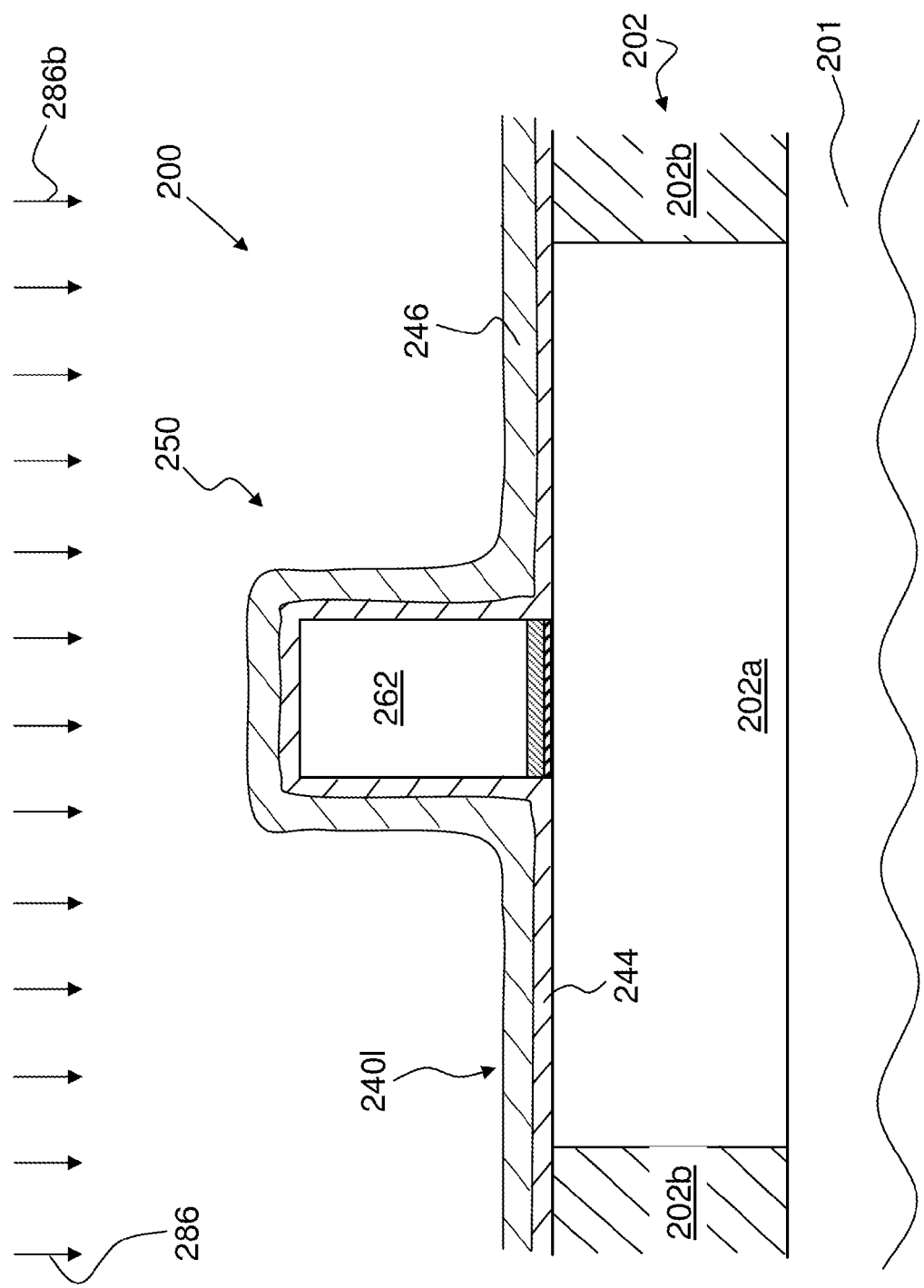
Figure 2D:
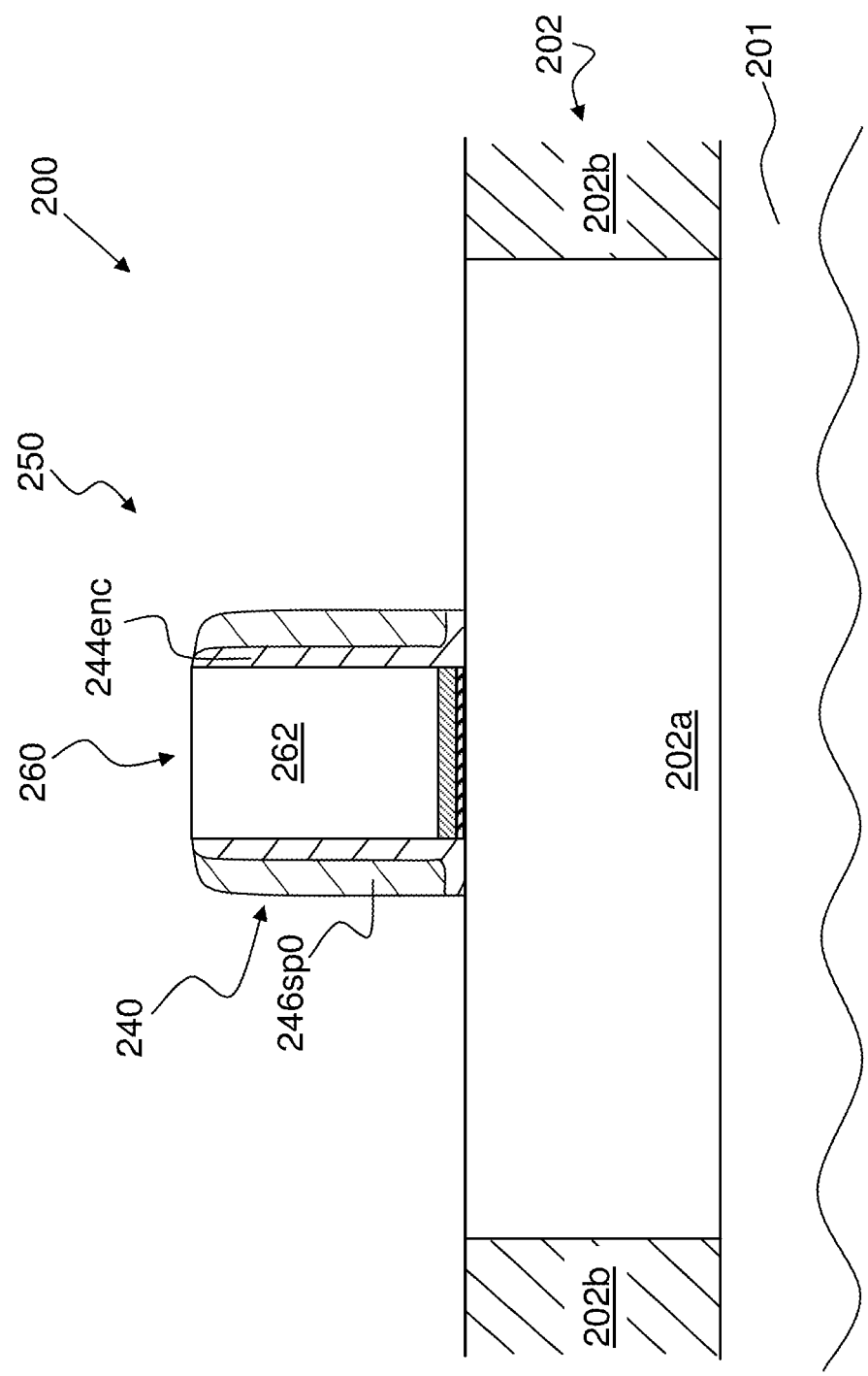
Figure 2E:
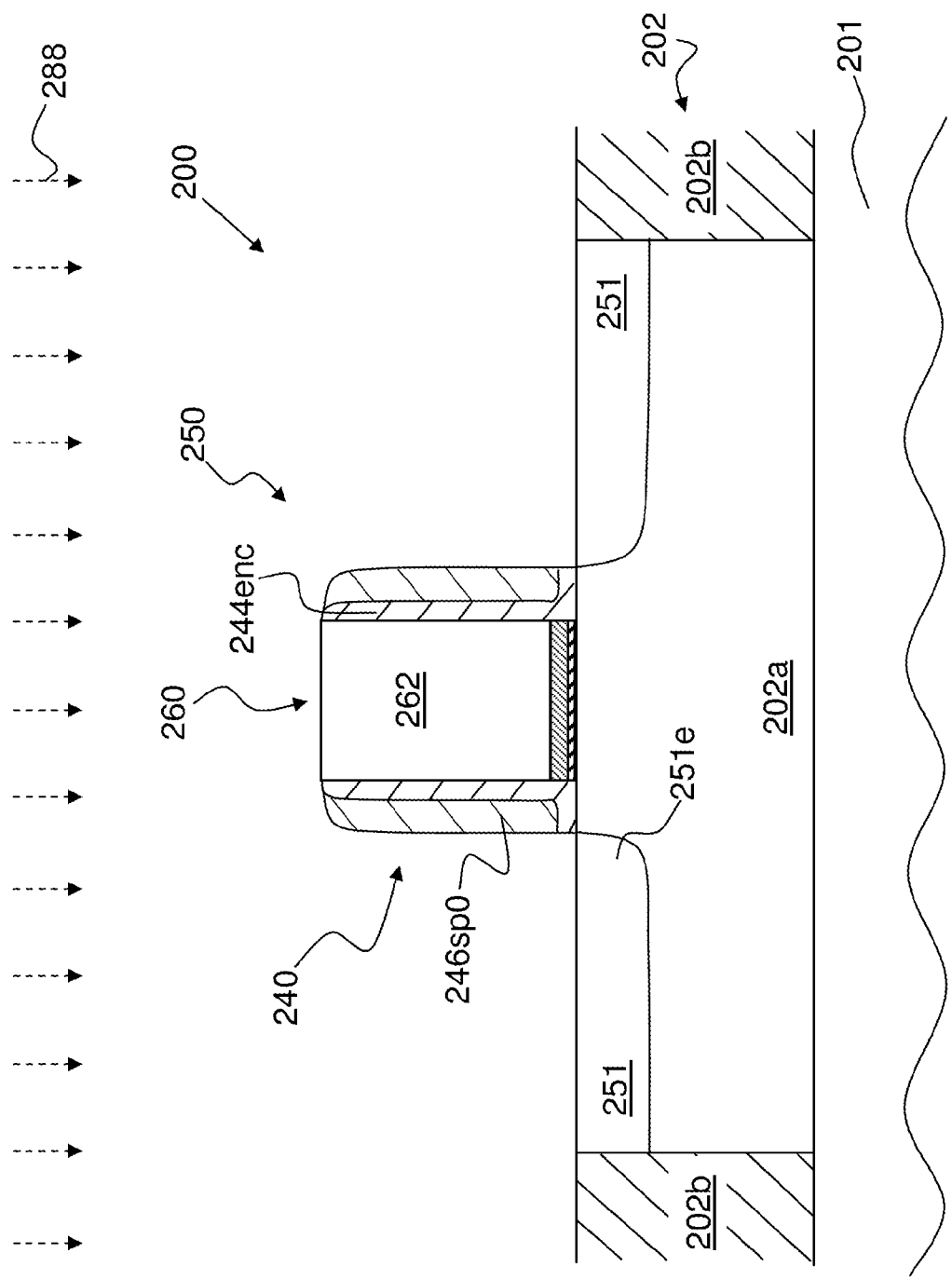
Figure 2F:
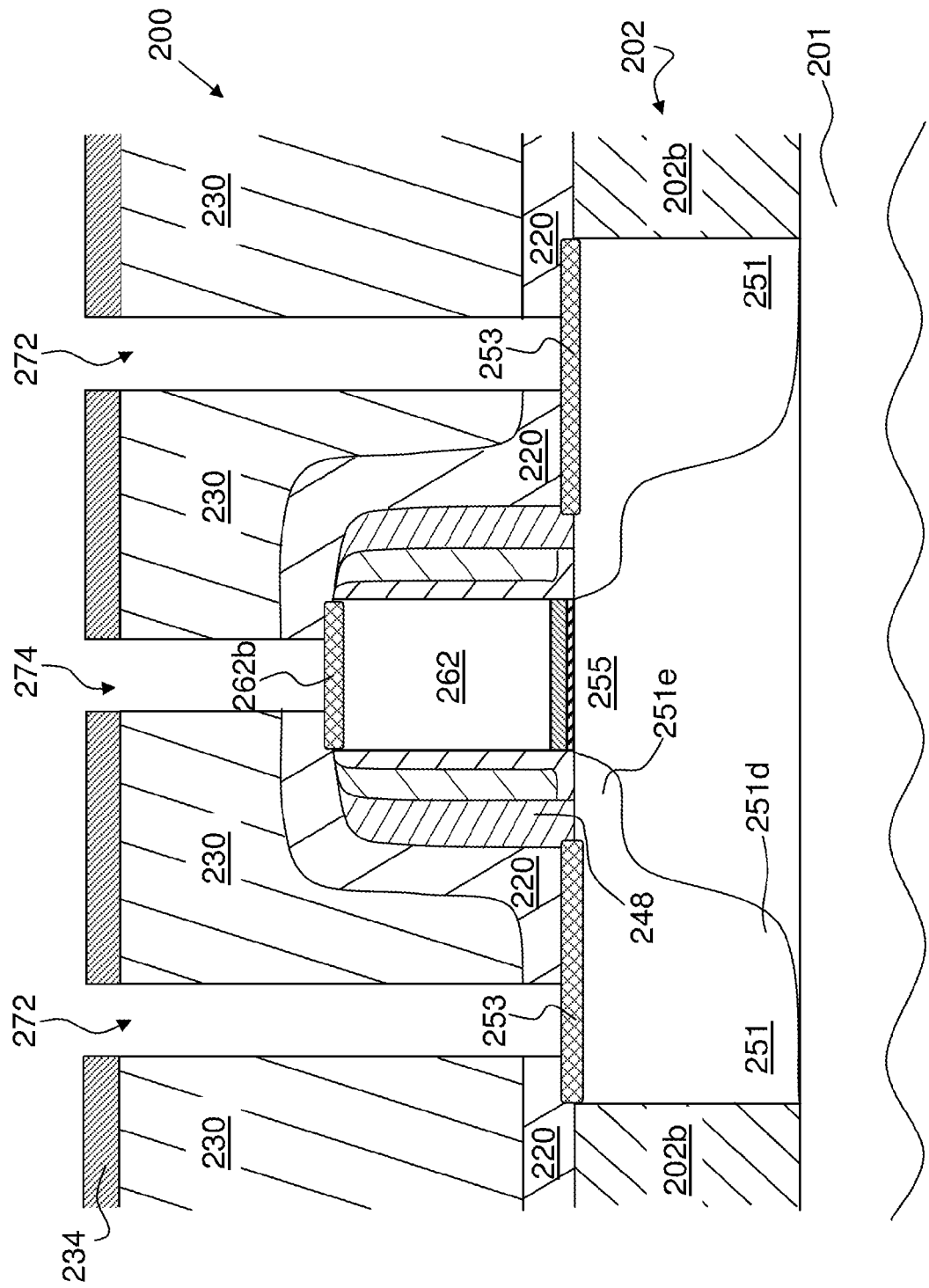
Figure 3:
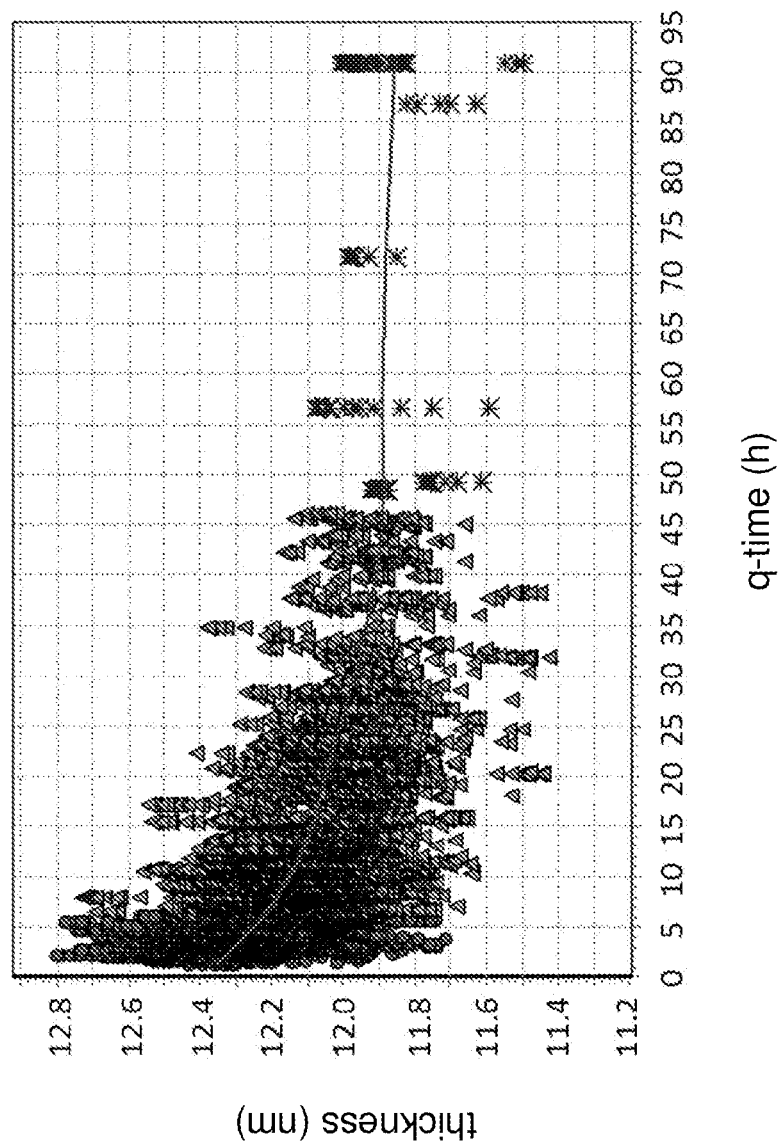
FIG. 3 illustrates a graph wherein the thicknesses of spacer structures obtained in the course of respective experiments have been plotted as a function of the waiting time between a first deposition and a second deposition.
Figure 4C:
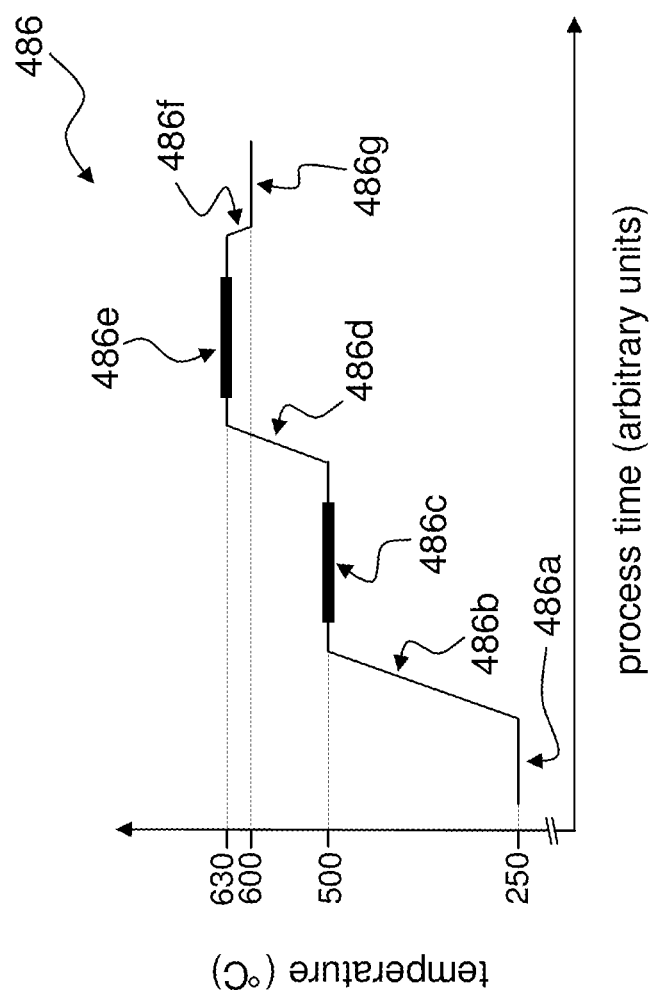
FIG. 4c shows a graph of temperature as a function of time for a deposition process according to an embodiment of the invention.

It should be noted that, where appropriate, the reference numbers used in describing the various elements illustrated in FIGS. 2a-2f and in FIGS. 4a-3c substantially correspond to the reference numbers used in describing the corresponding elements illustrated in FIGS. 1a-1g above, except that the leading numeral for has been changed from a "1" to a "2," or from a "1" to a "4." For example, semiconductor structure "100" corresponds to semiconductor structure "200," semiconductor layer "102" corresponds to semiconductor layer "202," gate structure "160" corresponds to gate structure "260," spacer structure "140" corresponds to gate structure "240," ion implantation "188" corresponds to ion implantation "288," and so on. Accordingly, the reference number designations used to identify some elements of the presently disclosed subject matter may be illustrated in FIGS. 2a-2f and/or FIGS. 4a-4c, but may not be specifically described in the following disclosure. In those instances, it should be understood that the numbered elements shown in FIGS. 2a-2f and/or FIGS. 4a-4c which are not described in detail below substantially correspond to their like-numbered counterparts illustrated in FIGS. 1a-1g and described in the associated disclosure set forth above.

Analogously, reference numbers used in FIG. 4c substantially correspond to the reference numbers used in describing the corresponding elements illustrated in FIGS. 2a-2f except that the leading numeral has been changed from a "2" to a "4." For example, deposition process "286" corresponds to deposition "486." In general, where elements shown in FIGS. 4a-4c are not described in detail, it should be understood that the description given for their corresponding elements with reference to FIGS. 1a-1g and 2a-2f is applicable in those cases, unless otherwise noted.

Furthermore, it should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor structure 200 depicted in FIG. 2a, it should be understood that the gate electrode structure 260 is formed "above" the active region 202a and the semiconductor substrate 201 and that the semiconductor layer 202 is "below" or "under" the gate insulating layer 261. Similarly, it should also be noted that the first insulating layer 244 is positioned "adjacent to" the sidewalls of the gate electrode material 262, whereas, in special cases, the first insulating layer 244 may be positioned "on" the sidewalls of the gate electrode material 262 in those embodiments wherein no other layers or structures are interposed therebetween.

FIGS. 2a-2f show a semiconductor structure 200 and a method of fabrication thereof according to an embodiment of the present disclosure.

FIG. 2a shows a semiconductor structure 200 during a fabrication stage corresponding to that shown in FIG. 1a. As shown, the semiconductor structure 200 comprises a substrate 201, such as a semiconductor material and the like, above which a semiconductor layer 202 is formed. As said above, the substrate 201 and the semiconductor layer 202 may, depending on the device requirements, form an SOI architecture. Alternatively, the semiconductor layer 202 may be formed as a portion of the substrate 201, which is then preferably comprised of a mono-crystalline semiconductor.

In one embodiment, the semiconductor layer 202 comprises silicon. In a specific embodiment, the semiconductor layer 202 comprises mono-crystalline silicon. One or a plurality of active regions 202a have been formed in the semiconductor layer 202. For convenience, only one active region 202a has been shown. Active regions 202a are delimited by isolation regions 202b. Isolation regions 202b could be, for example, implemented as shallow trench isolations.

Although not shown in the figures, it should be noticed that, after forming active regions 202a, one or more well implantations may be performed in order to define well regions in active regions 202a. Well regions are lightly doped areas containing impurities of an opposite polarity to that of the main charge carriers in the transistor channel region. For instance, if an N-channel transistor is to be formed in and on top of active region 202a, P-dopants in low doses may be implanted by means of the well implantations. Conversely, if a P-channel transistor is to be formed in and on top of active region 202a, well implantations may be performed so as to introduce a low concentration of N-dopants into active region 202a.

The transistor 250 has been partially formed in and on the active region 202a. According to one embodiment, the transistor 250 is a field effect transistor. According to a more specific embodiment, the transistor 250 is a metal-oxide-semiconductor FET (MOSFET).

The transistor 250 comprises a gate structure 260, which has been formed on the surface of the active region 202a. As described above with reference to FIG. 1a, the gate structure 260 comprises gate electrode material 262 and gate insulation layer 261. The gate electrode material 262 typically comprises polycrystalline silicon. The length of the gate structure 260 is defined as the extension of the gate electrode material 262 along the horizontal direction in the figures. According to one embodiment, the length of the gate structure 262 is less than about 50 nm. According to a particular embodiment, the length of the gate structure 262 is less than about 35 nm. The gate insulation layer 261 may vary depending on the technology used for forming the gate structure 260.

According to one embodiment, the gate structure 260 has been formed according to a conventional poly/SiON technology. According to this embodiment, the gate structure 260 comprises an oxide, such as silicon dioxide or silicon oxynitride.

According to an alternative, preferred embodiment, the gate structure 260 has been formed according to the HKMG technology. According to this embodiment, the insulation layer 261 comprises at least one high-k gate dielectric material. For example, the insulation layer 261 may comprise one of the high-k materials included in the non-exhaustive list provided above when describing gate electrode structure 160 shown in FIG. 1a.

Still, with reference to FIG. 2a, the gate electrode structure 260 further comprises a gate metal layer 262a, interposed between insulation layer 261 and gate electrode material 262. The gate metal layer 262a is advantageously used in HKMG technology in order to tune the transistor threshold voltage to a desired value. The gate metal layer 262a typically comprises tantalum nitride, possibly in combination with a work function metal, such as aluminum.

As said above, sensitive materials included in the gate stack 260 should be protected during the subsequent stage of the semiconductor device manufacturing process flow. In particular, the gate metal layer 262a and/or the insulation layer 261 should be protected from contamination with residual gases, which diffuse at a high rate at the high temperatures reached during the process thermal budget. Specially, oxygen might likely diffuse into the gate metal layer 262a and promptly react with the metallic layer, thereby forming oxides, affecting its chemical and physical properties. A spacer structure is then formed on the sidewalls of the gate electrode structure 260 in order to protect these sensitive materials.

Since the spacer structure is also used as a mask during the implantation steps performed in order to define the source and drain regions of the transistor, the spacer structure is initially formed so as to have a smaller thickness, which may be subsequently increased after performing a first series of implantations. More specifically, an encapsulating portion of the spacer structure is initially formed on or adjacent to the sidewalls of the gate electrode structure 260. This encapsulating portion is then broadened by means of a portion of the spacer structure called spacer-0 having a predetermined thickness. A first series of implantations is then performed comprising, for example, halo and extension implantations. The spacer structure is then normally broadened by adding an outer portion called spacer-1. A second series of implantations, comprising, for example, deep implantations, is then performed in the presence of the broadened spacer structure.

The present disclosure provides an innovative method for forming the spacer structure prior to the first series of implantations, i.e., prior to halo and extension implantations. In other words, the present invention provides an innovative, advantageous method for forming the portion of the spacer structure comprised of the encapsulating portion and spacer-0. FIGS. 2b-2d and 4c schematically illustrate the proposed method.

With reference to FIGS. 2b and 2c, the method proposed by the present disclosure relies on a single deposition step 286 to be used in order to form the encapsulating portion of the spacer structure and spacer-0. In FIG. 4c, the sequence of operations making up deposition 286 are schematically represented by a broken line 486 in a plot of temperature versus process time.

Deposition 286 is performed by ALD and is divided into two stages, indicated by the reference numerals 286a and 286b in FIGS. 2b and 2c, respectively. The first stage 286a and the second stage 286b of deposition process 286 are performed at different temperatures. The first stage 286a and the second stage 286b are performed in the same deposition chamber or reactor.

FIG. 2c shows that, as a result of deposition of deposition process 286, a film 2401 of an insulating material is formed on the surface of the semiconductor layer 200. At the end of deposition process 286, the film 2401 deposited by means of deposition 286 is comprised of a first portion 244 deposited during the first deposition stage 286a and a second portion 246 deposited during the second deposition stage 286b.

With reference to FIG. 2b, the first stage 286a of deposition 286 results in the formation of the first portion 244 of insulating layer 2401. In one embodiment, the first portion 244 comprises silicon nitride. The first portion 244 of insulating layer 2401 is formed so as to be adjacent to the sidewalls of the gate structure 260. In one embodiment, the first portion 244 is formed directly on the sidewalls of the gate structure 260, without any intermediate layers.

The first stage 286a of deposition 286 is performed in an analogous manner as deposition 182 described above with reference to FIG. 1b. The first stage 286a of deposition 286 and related operations correspond to segments 486a-486c of line 486 shown in FIG. 4c.

With reference to FIG. 4c, deposition 486 starts with a boat push at 250° C. into the deposition or reaction chamber into which the deposition is to take place, as shown by segment 486a. The temperature is then ramped up to the deposition temperature, as shown by segment 486b. According to one embodiment, the temperature at the end of the ramp and at which the first deposition stage 286a is performed is in the range of 450-550° C. FIG. 4c shows a particular embodiment according to which the first stage of the atomic-layer deposition is performed at a temperature of about 500° C.

After the final temperature has been reached at the end of ramp 486b, the first deposition stage 286a is performed, as indicated by the full rectangle in segment 486c. The first deposition stage is performed by means of an ALD resulting in the formation of the first portion 244 of the insulating layer 2401 to be deposited. Preferably, silicon nitride is deposited during the first stage of the ALD represented by segment 486c. According to one embodiment, the first portion 244 of insulating layer 2401 has a thickness between 3-4 nm. According to a particular embodiment, the first portion 244 of insulating layer 2401 has a thickness of about 3.5 nm.

The first portion 244 of layer 2401, preferably formed so as to be in contact with the gate structure 260, is adapted to be patterned in order to form the encapsulating portion of the spacer structure. Thus, a temperature of about 500° C. is preferred when depositing the first portion 244 by ALD, since this range of temperatures allows for the formation of a conformal insulating layer, while simultaneously preventing residual oxygen from diffusing through the gate stack 260 during the deposition.

Referring to FIG. 2c, after performing the first stage 286a of deposition process 286, the second stage 286b of deposition 286 is carried out, resulting in the formation of the second portion 246 of the insulating layer 2401 to be formed by means of deposition 286. During the second stage 286b of deposition process 286, the same material as deposited with the first stage 286a is deposited. Thus, according to a preferred embodiment, silicon nitride is deposited during the second stage 286b.

Again with reference to FIG. 4c, the second stage 286b of deposition process 286 and its related operations are illustrated by segments 486d-486g. As shown by segment 486d, after performing the first deposition stage during segment 486c, the temperature is increased again until it reaches a target value at which the second deposition stage is to be performed.

It should be observed that during the temperature ramp 486d and, in general, during the time interval separating the second deposition stage 286b from the first deposition stage 286a, the support (e.g., wafer) in which the semiconductor structure 200 is formed is not extracted from the deposition chamber. The second deposition stage 286b is then performed in the same deposition chamber in which the first deposition stage 286a has been previously carried out. Thus, the surface of the semiconductor structure 200 is prevented from being exposed to air at atmospheric pressure during the entire course of deposition 286.

According to one embodiment, the second deposition stage 286b is performed at a temperature in the range of 600-650° C. According to a preferred embodiment shown in FIG. 4c, the second deposition stage 286b is performed at a temperature of about 630° C.

According to one embodiment, the surface of the semiconductor structure 200 in the deposition chamber is purged by means of a gaseous flow during the temperature uphill ramp represented by segment 486d. According to a particular embodiment, the gaseous flow used for purging the semiconductor structure 200 is provided by pure nitrogen. In this manner, all non-reacted gases introduced into the deposition chamber in the course of the first deposition stage may be eliminated before the beginning of the second deposition stage.

After reaching the desired target temperature at the end of temperature ramp 486d, the second deposition stage 286b is performed, as indicated by the full rectangle in segment 486e. The second deposition stage is performed by means of an ALD, as well as the first deposition stage. Thus, the first and the second deposition stage shown in segments 486c and 486e, respectively, are two sub-steps of a single ALD process performed at two different temperatures.

The second deposition stage results in formation of the second portion 246 of insulating layer 2401. The second portion 246 of insulating layer 2401 is formed directly on the surface of the first portion 244 previously deposited. According to one embodiment, the second portion 246 of insulating layer 2401 has a thickness in the range of 8-9 nm. According to a particular embodiment, the second portion 246 of insulating layer 2401 has a thickness of about 8.5 nm.

The second portion 246 of insulating layer 2401, formed onto the first portion 244, is adapted to be patterned in order to form the portion of the spacer structure called spacer-0. Since spacer-0 has a surface which is exposed to the outside of the semiconductor structure 200, spacer-0 is preferably formed so as to withstand the series of chemical etches performed in order to pattern or clean the surface of the semiconductor structure 200 after formation of the spacer structure. Thus, the temperature of about 630° C. guarantees that a spacer-0 obtained as a result of an ALD process has a comparable toughness to wet or dry etches to that of a spacer-0 formed as a result of a traditional LPCVD process, such as that discussed before with reference to FIGS. 1c and 4b. Therefore, by performing an ALD at a temperature slightly above 600° C., a spacer-0 may be formed of a comparable quality to that of a spacer-0 formed by means of an LPCVD at 750° C.

After accomplishing the second stage 286b of the ALD represented in segment 486e, the temperature is decreased, as indicated by segment 486f. According to one embodiment, the temperature may be decreased to a temperature of about 600° C. Boat pull then completes the second stage 286b at the end of temperature downhill ramp 486f. Boat pull, represented as segment 486g, also completes deposition process 286.

With reference to FIG. 2c, after performing the second stage 286b and at the end of the deposition process 286, insulating layer 2401 comprises a first portion 244 formed adjacent to gate electrode material 262 and a second portion 246 formed onto first portion 244 and having a surface exposed to the outside. According to one embodiment, insulating layer 2401 resulting from deposition process 286 has a final thickness in the range of 11-13 nm. According to a particular embodiment, the thickness of insulating layer 2401 at the end of deposition process 286 is about 12 nm.

FIG. 2d, substantially analogous to FIG. 1d, shows that insulating layer 2401 formed by means of deposition process 286 may be patterned in order to obtain spacer structure 240 having a first thickness. Patterning may include an anisotropic, directional etch process. For example, patterning may be achieved by dry etching.

The spacer structure 240 obtained through patterning of insulating layer 2401 comprises an encapsulating portion 244enc formed adjacent to the sidewalls of gate structure 160. Encapsulating portion 244enc of spacer structure 240 has been obtained as a portion of the first portion 244 of insulating layer 2401. In the stage of the manufacturing process flow shown in FIG. 2d, the spacer structure 240 further comprises an outer portion 246sp0 exposed to the outside and obtained as a portion of the second portion 246 of insulating layer 2401. The outer portion 246sp0 forms the portion of the spacer structure 240 called spacer-0.

The spacer structure 240 consisting of an encapsulating portion 244enc and of spacer-0 246sp0 shown in FIG. 2d has been obtained as a result of a single atomic layer deposition process divided into two stages. Both stages are performed in a single deposition chamber.

The time interval separating the second stage from the first stage may be precisely controlled. In general, the time interval may be chosen at will in a range bounded by the minimum time required for increasing the temperature between the first deposition stage and the second deposition stage during the segment 486d shown in FIG. 4c. According to one embodiment, the time interval between the first and the second deposition stage may be in the range of 10 minutes to 1 hour. In this manner, the thickness of the resulting spacer structure may be set in advance with a high degree of precision.

Thus, the proposed method allows for eliminating the undesired effect of the thickness variation of the spacer structure arising from the impossibility of exactly controlling the waiting time between an ALD initially performed and an LPCVD following the initial ALD. In particular, the thickness of the spacer structure obtained by using the claimed method may be made constant through the whole production process. Run-to-run variations of the spacer thickness may thus be eliminated, thereby achieving a high degree of process repeatability.

The claimed method relies on a single ALD process for depositing both the encapsulating portion of the spacer structure and spacer-0. The ALD is performed in two subsequent stages. The encapsulating portion is deposited during a first stage of an ALD performed at a temperature guaranteeing effective protection of the gate stack from contamination with residual gas species in the reaction chamber. Spacer-0 is then obtained from the second stage of the ALD performed at a second temperature higher than that of the first stage. The second temperature is chosen so that the spacer-0 obtained from the ALD has equally high performances, e.g., in terms of toughness to etches and low etch rate, as compared to a spacer-0 formed as a result of a traditional LPCVD process.

The first and second stage of the ALD are performed within the same chamber. Furthermore, the substrate in which the semiconductor structure is formed is maintained within the chamber during the whole time interval separating the second deposition stage from the first deposition stage. Therefore, the surface of the first layer portion deposited by means of the first stage is not exposed to air at atmospheric pressure between the end of the first stage and the beginning of the second one. Thus, the second portion may be deposited directly on the free surface of the first portion, without the presence of an intermediate oxide or impurity film. This in contrast to the method known from the prior art, wherein an ALD is first performed in a first chamber, followed by an LPCVD performed in a second chamber different from the first one. In this case, as discussed above, oxidation of the film grown during the ALD is observed, resulting from the exposure of the sample to air between the ALD and the LPCVD.

Thus, the present disclosure proposes to replace the traditional two-step deposition performed in two different chambers with a single deposition step consisting of two stages performed in the same chamber. Operating with a single reaction chamber instead of two also enables better throughput and manufacturability, especially for high-volume manufacturing.

After forming spacer structure 240 of a first thickness as shown in FIG. 2d, a series of ion implantations 288 may be performed, as show in FIG. 2e. Implantations 288 may be performed in order to define extension regions 251e of source and drain regions 251 and/or halo regions (not shown) in active region 202a. It should be noticed that implantations 288 result in a well-defined, desired implantation profile, since spacer structure 240 has a precise, predetermined thickness.

The manufacturing process flow continues in the traditional manner described above with reference to FIGS. 1f and 1g.

FIG. 2f shows the semiconductor structure 200 during a fabrication stage following that shown in FIG. 2e and corresponding to that shown in FIG. 1g. As shown in FIG. 2f, the spacer structure 240 is broadened by adding the outer portion 248 called spacer-1. Thereafter, deep regions 251d included in source and drain regions 251 are formed by means of an additional series of implantation steps (not shown). The semiconductor structure 200 may subsequently be annealed in order to activate the implanted dopants and cause the crystal lattice of the semiconductor layer to re-crystallize after implantation damage. This completes the formation of source and drain regions 251 of the transistor 250 and defines the channel region 255 of the transistor 250 as the portion of the active regions 202a delimited by extension regions 251e. After performing the activating annealing, a refractory metal layer (not shown) is deposited onto the surface of the semiconductor structure 200. The refractory metal preferably comprises nickel.

After depositing the refractory metal layer, a silicidation process (e.g., a heat treatment) is applied, resulting in formation of metal semiconductor layer 262b on the upper edge of the gate electrode 260 and metal semiconductor layer 253 in correspondence to the source/drain regions 251. Metal semiconductor layers 253 and 262b are preferably nickel silicide layers, although they may contain other species.

As shown in FIG. 2f, after formation of silicide layers 253 and 262b, a stressed material layer 220 is deposited onto the surface of the semiconductor structure 200. Subsequently, a UV curing process is applied at a temperature ranging from 400-500° C.

An interlayer dielectric layer 230 is then deposited onto the stressed material layer 220. An etching process is then applied, for example, through patterned mask 234, in order to form via openings 272 and 274. Openings 272 expose predetermined portions of the metal semiconductor layer 253 contacting the source and drain regions 251. On the other hand, via openings 274 expose predetermined portions of the metal semiconductor layer 262b contacting the gate electrode material 262.

Finally, via openings 272 and 274 may be filled with a metal, for example tungsten, so as to form electrical contacts to the source and drain regions and to the gate electrode material of transistor 250.

The present invention thus provides a method for forming spacer structures of a well-defined thickness and shape. In particular the thickness of spacer structures prior to extension and/or halo implantations may be selected in advance with a high degree of accuracy. The disclosed method finds a particularly advantageous application in the HKMG technology and, in particular, in the gate-first HKMG approach. The method may be advantageously applied to advanced semiconductor fabrication technologies such as 32-nm technology, 22-nm technology and beyond.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor structure, comprising:
   forming a gate structure on an active region of a semiconductor layer; and
   performing an atomic layer deposition so as to deposit an insulating layer adapted to be formed as a spacer structure on the sidewalls of said gate structure;
   wherein said step of performing said atomic layer deposition comprises:
   performing a first deposition stage at a first temperature to form a first portion of said insulating layer having a first thickness; and
   performing a second deposition stage at a second temperature after said first deposition stage to form a second portion of said insulating layer having a second thickness greater than said first thickness, said second temperature being higher than said first temperature;
   wherein said first and second deposition stages of said atomic layer deposition are performed within the same deposition chamber.

2. The method of claim 1, wherein said insulating layer is deposited so as to be in contact with said sidewalls of said gate structure.

3. The method of claim 1, further comprising:
   inserting said transistor structure into said deposition chamber before performing said first stage of said atomic layer deposition; and
   keeping said transistor structure inside said deposition chamber until after said second stage of said atomic layer deposition has been accomplished.

4. The method of claim 1, wherein said first deposition stage of said atomic layer deposition is performed at a temperature of about 500° C.

5. The method of claim 1, wherein said second deposition stage of said atomic layer deposition is performed at a temperature in the range of about 600-650° C.

6. The method of claim 1, wherein said insulating layer deposited by means of said atomic layer deposition comprises silicon nitride ($Si_3N_4$).

7. The method of claim 1, wherein the portion of said insulating layer deposited during said first deposition stage of said atomic layer deposition has a thickness in the range of 3-4 nm.

8. The method of claim 1, wherein the portion of said insulating layer deposited by means of said second deposition stage of said atomic layer deposition has a thickness in the range of 8-9 nm.

9. The method of claim 1, wherein the thickness of said insulating layer after performing said atomic layer deposition is in the range of 11-13 nm.

10. The method of claim 1, wherein the time interval between said first deposition stage and said second deposition stage of said atomic layer deposition is in the range of 10 minutes to 1 hour.

11. The method of claim 1, further comprising purging the surface of said transistor structure after performing said first deposition stage and before starting said second deposition stage of said atomic layer deposition.

12. The method of claim 11, wherein said step of purging is performed by means of a nitrogen gaseous flow.

13. The method of claim 1, further comprising processing said deposited layer after said atomic layer deposition in order to form said spacer structure.

14. The method of claim 13, wherein said step of processing said deposited layer comprises an anisotropic etch.

15. The method of claim 13, further comprising performing one or more than one dopant ion implantations onto said active region of said semiconductor layer, said one or more than one ion implantations being performed after forming said spacer structure.

16. The method of claim 13, further comprising:
   depositing a second layer onto said spacer structure; and
   processing said second layer in order to obtain a broadened spacer structure.

17. The method of claim 16, further comprising:
   performing one or more than one dopant ion implantations in the presence of said broadened spacer structure; and
   annealing said semiconductor layer at a predetermined temperature.

18. The method of claim 1, wherein said semiconductor layer comprises crystalline silicon.

19. The method of claim 1, wherein said transistor comprises a field effect transistor.

20. The method of claim 1, wherein said gate structure is formed according to the high-k/metal gate technology.

21. A method of forming a transistor structure, comprising:
   forming a gate structure on an active region of a semiconductor layer; and
   performing an atomic layer deposition so as to deposit an insulating layer adapted to be formed as a spacer structure on sidewalls of said gate structure, wherein said step of performing said atomic layer deposition comprises:
   performing a first deposition stage at a temperature of about 500° C. to form a first portion of said insulating layer having a first thickness; and
   after performing said first deposition stage, performing a second deposition stage at a temperature in a range of about 600-650° C. to form a second portion of said insulating layer on said first portion of said layer of insulating material, said second portion having a second thickness greater than said first thickness, and wherein said first and second deposition stages of said atomic layer deposition are performed within a same deposition chamber.

22. The method of claim 21, wherein said insulating layer deposited by means of said atomic layer deposition is made of silicon nitride ($Si_3N_4$).

23. A method of forming a transistor structure, comprising:
   forming a gate structure on an active region of a semiconductor layer; and performing an atomic layer deposition so as to deposit an insulating layer made of silicon nitride that is adapted to be formed as a spacer structure on sidewalls of said gate structure, wherein said step of performing said atomic layer deposition comprises:

performing a first deposition stage at a temperature of about 500° C. to form a first portion of said insulating layer having a first thickness;

after performing said first deposition stage, purging the surface of said transistor structure by means of a nitrogen gaseous flow; and after performing said purging step, performing a second deposition stage at a temperature in a range of about 600-650° C. to form a second portion of said insulating layer on said first portion of said layer of insulating material, said second portion having a second thickness greater than said first thickness, and wherein said first and second deposition stages of said atomic layer deposition are performed within a same deposition chamber.

* * * * *